(12) United States Patent
Adachi et al.

(10) Patent No.: US 6,458,475 B1
(45) Date of Patent: Oct. 1, 2002

(54) ORGANIC LIGHT EMITTING DIODE HAVING A BLUE PHOSPHORESCENT MOLECULE AS AN EMITTER

(75) Inventors: Chihaya Adachi, East Windsor; Stephen R. Forrest, Princeton, both of NJ (US)

(73) Assignee: The Trustee of Princeton University, Princeton, NJ (US)

( * ) Notice: Subject to any disclaimer, the term of this patent is extended or adjusted under 35 U.S.C. 154(b) by 0 days.

(21) Appl. No.: 09/449,363

(22) Filed: Nov. 24, 1999

(51) Int. Cl.[7] ............................................. H05B 33/14
(52) U.S. Cl. ....................... 428/690; 428/917; 313/504; 313/506
(58) Field of Search ................................ 428/690, 704, 428/917; 313/504, 506

(56) References Cited

U.S. PATENT DOCUMENTS

| | | | |
|---|---|---|---|
| 5,281,489 A | 1/1994 | Mori et al. | 428/690 |
| 5,703,436 A | 12/1997 | Forrest et al. | 313/506 |
| 5,707,745 A | 1/1998 | Forrest et al. | 428/432 |
| 5,747,183 A | 5/1998 | Shi et al. | 428/690 |
| 5,757,026 A | 5/1998 | Forrest et al. | 257/40 |
| 5,757,139 A | 5/1998 | Forrest et al. | 315/169.3 |
| 5,779,937 A | 7/1998 | Sano et al. | 252/301.16 |
| 5,811,833 A | 9/1998 | Thompson | 257/40 |
| 5,834,893 A | 11/1998 | Bulovic et al. | 313/506 |
| 5,844,363 A | 12/1998 | Gu et al. | 313/506 |
| 5,858,560 A | 1/1999 | Nakamura et al. | 428/690 |
| 5,861,219 A | 1/1999 | Thompson et al. | 428/690 |
| 5,874,803 A | 2/1999 | Garbuzov et al. | 313/506 |
| 5,917,280 A | 6/1999 | Burrows et al. | 313/506 |
| 5,932,895 A | 8/1999 | Shen et al. | 257/89 |
| 5,986,401 A | 11/1999 | Thompson et al. | 313/504 |
| 6,013,982 A | 1/2000 | Thompson et al. | 313/506 |
| 6,045,930 A | 4/2000 | Thompson et al. | 428/690 |
| 6,046,543 A | 4/2000 | Bulovic et al. | 313/504 |
| 6,048,630 A | 4/2000 | Burrows et al. | 428/690 |
| 6,091,195 A * | 7/2000 | Forrest et al. | 313/504 |
| 6,111,902 A * | 8/2000 | Kozlov et al. | 372/39 |
| 6,125,226 A * | 9/2000 | Forrest et al. | 385/131 |
| 6,150,042 A * | 11/2000 | Tamano et al. | 428/690 |
| 6,194,090 B1 * | 2/2001 | Okada | 428/690 |

FOREIGN PATENT DOCUMENTS

| | | |
|---|---|---|
| EP | 0 700 917 | 3/1996 |
| EP | 0 847 228 | 6/1998 |
| WO | 96/19792 | 6/1996 |
| WO | 97/33296 | 9/1997 |
| WO | 97/48115 | 12/1997 |
| WO | 97/48139 | 12/1997 |
| WO | 98/50989 | 11/1998 |

OTHER PUBLICATIONS

Y. Kunugi, et al., "A Vapochromic LED", *J. Am. Chem. Soc.*, vol. 120, No. 3, pp. 589–590, 1998. (No month).

C.W. Tang, et al., "Organic Electroluminescent Diodes", 51 *Appl. Phys. Lett.*, pp. 913–915, Sep. 1987.

S.R. Forrest, et al., "Organic Emitters Promise a New Generation of Displays", *Laser Focus World*, (Feb. 1995), pp. 99–107.

Baldo, et al., "Very high efficiency green organic light–emitting devices based on electrophosphorescence", 75 *Applied Physics Letters*, 4–6, Jul. , 1999.

C.H. Chen, et al., "Recent developments in molecular organic electroluminescent materials", *Macromolecular Symposia*, 125, 1–48 (1997), (No month).

M.A. Baldo, et al., "Highly efficient phosphorescent emission from organic electroluminescent devices", *Nature*, vol. 395, 151–154, (Sep. 1998).

C. W. Tang, et al., "Electroluminescence of doped organic thin films," 65 *J. Appl. Phys.*, 3610–3616, (May 1989).

V. Bulovic, et al., "Bright, saturated, red–to–yellow organic light–emitting devices based on polarization–induced spectral shifts," *Chem. Phys. Lett.*, 287, 455–460 (May 1998).

N. Nakamura, et al., "A Novel blue light emitting material prepared from 2–(o–Hydroxyphenyl)benzoxazole", *Chemistry Letters*, No. 9, pp. 1741–1742, 1994, (No month).

Y. Hamada, et al., "White–light–emitting material for organic electroluminescent devices", *Jpn. J. Appl. Phys.*, vol. 35, Part 2, No. 10B, pp. 1339–1341, Oct. 15, 1996.

\* cited by examiner

*Primary Examiner*—Marie Yamnitzky
(74) *Attorney, Agent, or Firm*—Kenyon & Kenyon

(57) ABSTRACT

Improved electroluminescent efficiency in organic light emitting diodes is obtained with an emitter layer comprising organic complexes of transition metals with benzoxazole derivatives. A dimethylated benzoxazole derivative with zinc shows blue fluorescence and phosphorescence.

11 Claims, 10 Drawing Sheets

Fig. 1 (2.8%)

Fig. 3: J-V(2.8%)

Figure 4:
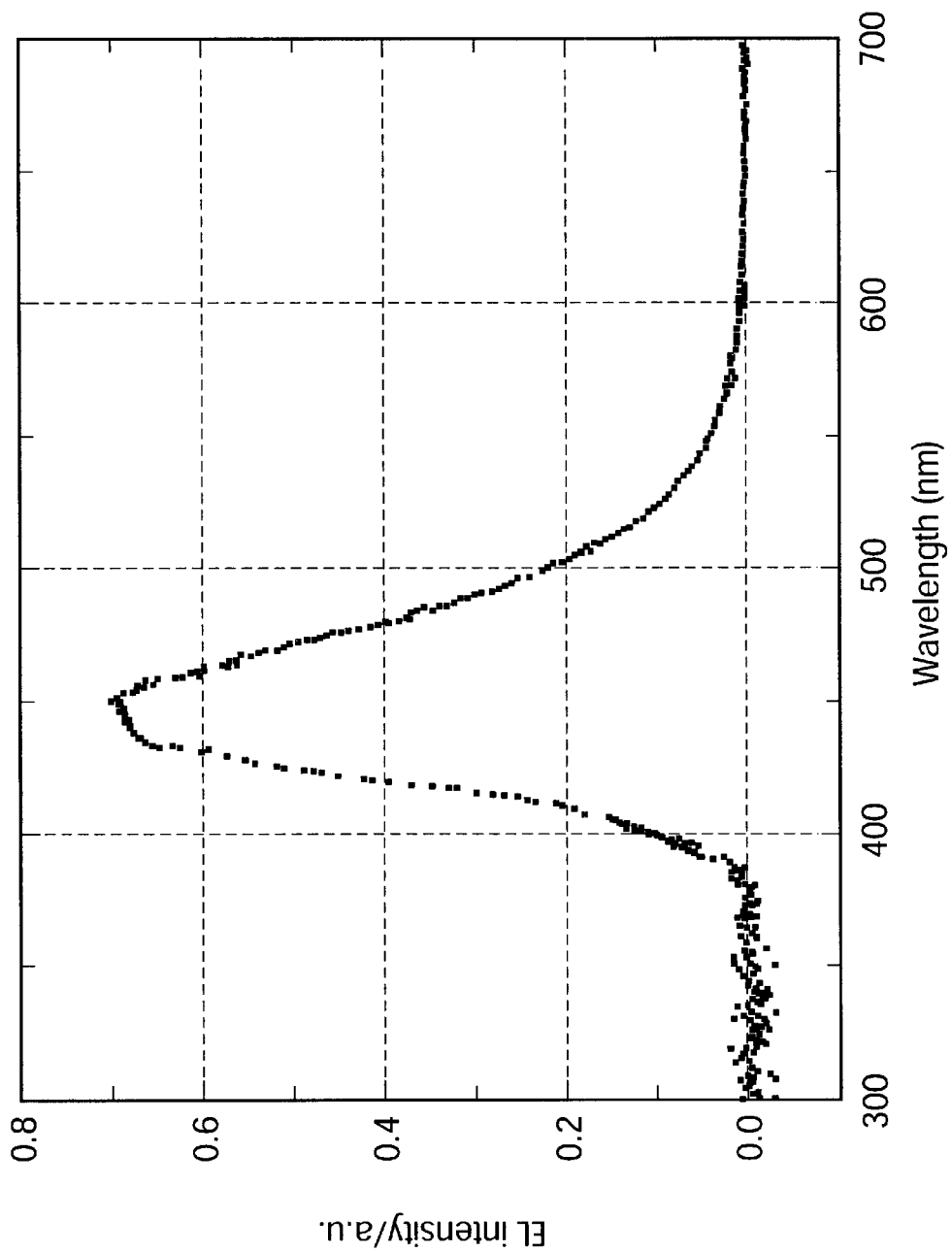

Fig. 4: EL spectrum (2.8%)

Figure 8:
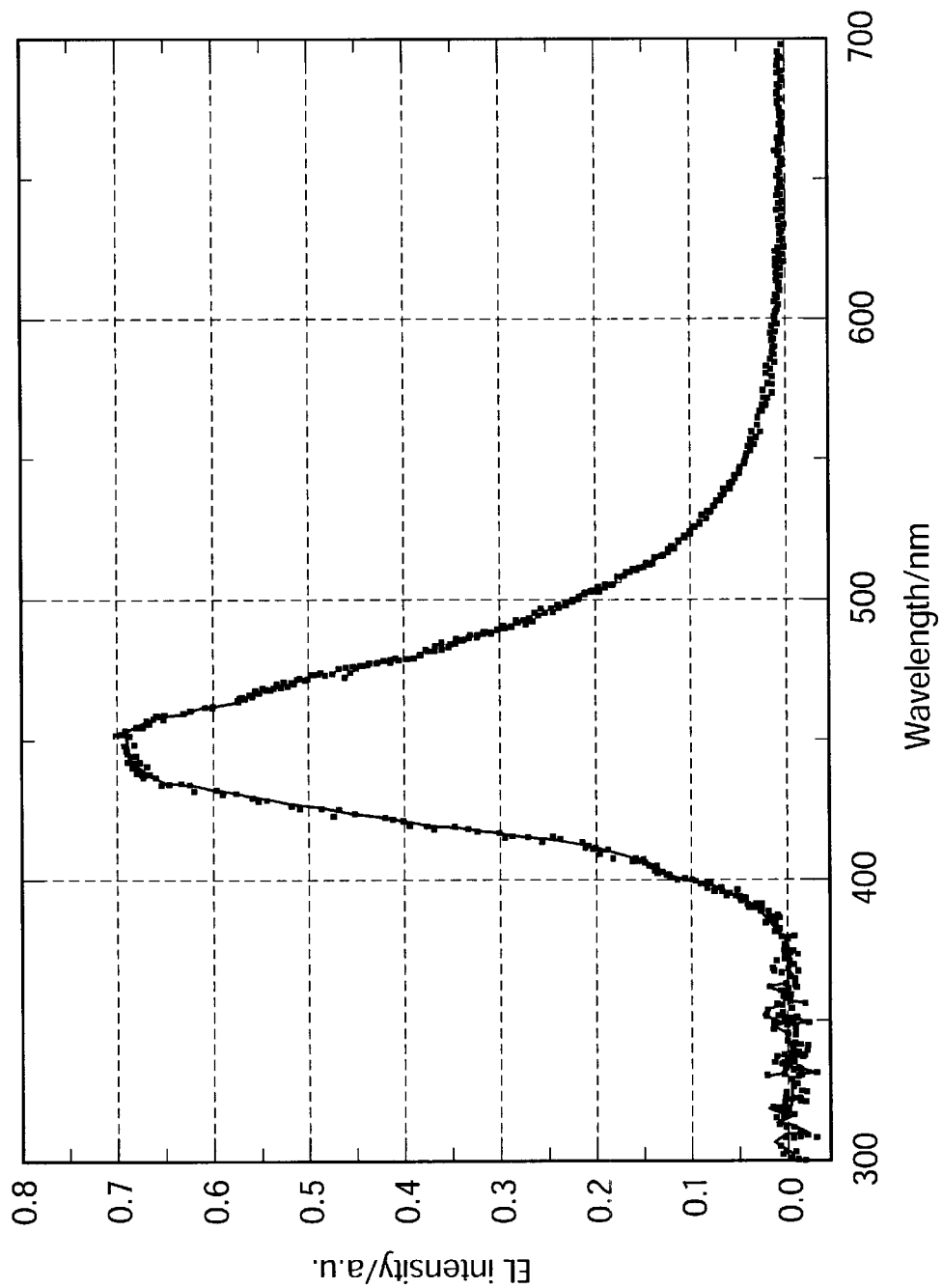

Fig. 8: EL spectrum (3.4%)

ORGANIC LIGHT EMITTING DIODE HAVING A BLUE PHOSPHORESCENT MOLECULE AS AN EMITTER

GOVERNMENT RIGHTS

This invention was made with Government support under Contract No. F49620-96-1-0277 awarded by the Air Force Office of Scientific Research (AFOSR). The government has certain rights in this invention.

I. FIELD OF INVENTION

The present invention is directed to the use of organometallic compounds, especially of certain benzoxazoles with transition metals, as dopants in certain hosts as emitters in organic light emitting diodes.

II. BACKGROUND OF THE INVENTION

II. A. General Background

Organic light emitting devices (OLEDs) are comprised of several organic layers in which one of the layers is comprised of an organic material that can be made to electroluminesce by applying a voltage across the device, C. W. Tang et al., Appl. Phys. Lett. 1987, 51, 913. Certain OLEDs have been shown to have sufficient brightness, range of color and operating lifetimes for use as a practical alternative technology to LCD-based full color flat-panel displays (S. R. Forrest, P. E. Burrows and M. E. Thompson, Laser Focus World, Feb. 1995). Since many of the thin organic films used in such devices are transparent in the visible spectral region, they allow for the realization of a completely new type of display pixel in which red (R), green (G), and blue (B) emitting OLEDs are placed in a vertically stacked geometry to provide a simple fabrication process, a small R-G-B pixel size, and a large fill factor, International Patent Application No. PCT/US95/15790.

A transparent OLED (TOLED), which represents a significant step toward realizing high resolution, independently addressable stacked R-G-B pixels, was reported in International Patent Application No. PCT/US97/02681 in which the TOLED had greater than 71% transparency when turned off and emitted light from both top and bottom device surfaces with high efficiency (approaching 1% quantum efficiency) when the device was turned on. The TOLED used transparent indium tin oxide (ITO) as the hole-injecting electrode and a Mg-Ag-ITO electrode layer for electron-injection. A device was disclosed in which the ITO side of the Mg-Ag-ITO layer was used as a hole-injecting contact for a second, different color-emitting OLED stacked on top of the TOLED. Each layer in the stacked OLED (SOLED) was independently addressable and emitted its own characteristic color. This colored emission could be transmitted through the adjacently stacked, transparent, independently addressable, organic layer or layers, the transparent contacts and the glass substrate, thus allowing the device to emit any color that could be produced by varying the relative output of the red and blue color-emitting layers.

PCT/US95/15790 application disclosed an integrated SOLED for which both intensity and color could be independently varied and controlled with external power supplies in a color tunable display device. The PCT/US95/15790 application, thus, illustrates a principle for achieving integrated, full color pixels that provide high image resolution, which is made possible by the compact pixel size. Furthermore, relatively low cost fabrication techniques, as compared with prior art methods, may be utilized for making such devices.

II.B. Background of emission

II.B.1. Basics

II.B.1.a. Singlet and Triplet Excitons

Because light is generated in organic materials from the decay of molecular excited states or excitons, understanding their properties and interactions is crucial to the design of efficient light emitting devices currently of significant interest due to their potential uses in displays, lasers, and other illumination applications. For example, if the symmetry of an exciton is different from that of the ground state, then the radiative relaxation of the exciton is disallowed and luminescence will be slow and inefficient. Because the ground state is usually anti-symmetric under exchange of spins of electrons comprising the exciton, the decay of a symmetric exciton breaks symmetry. Such excitons are known as triplets, the term reflecting the degeneracy of the state. For every three triplet excitons that are formed by electrical excitation in an OLED, only one symmetric state (or singlet) exciton is created. (M. A. Baldo, D. F. O'Brien, M. E. Thompson and S. R. Forrest, Very high-efficiency green organic light-emitting devices based on electrophosphorescence, Applied Physics Letters, 1999, 75, 4–6.) Luminescence from a symmetry-disallowed process is known as phosphorescence. Characteristically, phosphorescence may persist for up to several seconds after excitation due to the low probability of the transition. In contrast, fluorescence originates in the rapid decay of a singlet exciton. Since this process occurs between states of like symmetry, it may be very efficient.

Many organic materials exhibit fluorescence from singlet excitons. However, only a very few have been identified which are also capable of efficient room temperature phosphorescence from triplets. Thus, in most fluorescent dyes, the energy contained in the triplet states is wasted. However, if the triplet excited state is perturbed, for example, through spin-orbit coupling (typically introduced by the presence of a heavy metal atom), then efficient phosphoresence is more likely. In this case, the triplet exciton assumes some singlet character and it has a higher probability of radiative decay to the ground state. Indeed, phosphorescent dyes with these properties have demonstrated high efficiency electroluminescence.

Only a few organic materials have been identified which show efficient room temperature phosphorescence from triplets. In contrast, many fluorescent dyes are known (C. H. Chen, J. Shi, and C. W. Tang, "Recent developments in molecular organic electroluminescent materials," Macromolecular Symposia, 1997, 125, 1–48; U. Brackmann, Lambdachrome Laser Dyes (Lambda Physik, Gottingen, 1997) and fluorescent efficiencies in solution approaching 100% are not uncommon. (C. H. Chen, 1997, op. cit.) Fluorescence is also not affected by triplet-triplet annihilation, which degrades phosphorescent emission at high excitation densities. (M. A. Baldo, et al., "High efficiency phosphorescent emission from organic electroluminescent devices," Nature, 1998, 395, 151–154; M. A. Baldo, M. E. Thompson, and S. R. Forrest, "An analytic model of triplet-triplet annihilation in electrophosphorescent devices," 1999).

Consequently, fluorescent materials are suited to many electroluminescent applications, particularly passive matrix displays.

II.B.1.b. Overview of Invention Relative to Basics

This invention is directed to the use of complexes of metals, including zinc, as dopants in a host layer comprising to function as a emitter layer in organic light emitting diodes.

There are a few papers in the literature on Zn benzoxazoles. [N. Nakamura, S. Wakabayashi, K. Miyairi and T.

Fujii, Chem. Lett., 1741 (1994); Y. Hamada, T. Sano, T. Fujii, H. Takahashi, and K. Shibata, Jpn. J. Appl. Phys., 35, L1339 (1996))] These previous reports do not mention the phosphorescence emission at all. Further, the previous reports teach only the use of neat films as an emitter layer. There are no reports on the doped films. We examined the use of neat films of Zn(BOX)2; however, the OLED device using these neat films showed broad emission ranging from blue to yellow regions. Thus, the present invention on doped forms is the only report of phosphorescent blue emission suitable for use in OLEDs.

Generally, the metal compounds of the invention have the formula

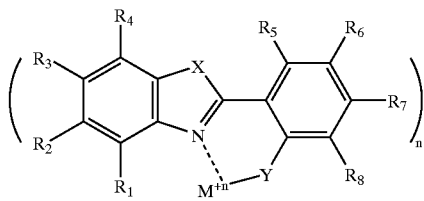

X, Y independently O, S

M represents a metal n is a integer for 1 to 3

$R_1$ to $R_8$ independently hydrogen atom, an aryl group or an alkyl group.

In this specification, we will use the term "BOX" to encompass any benzoxazole derivative as depicted above with X, Y, and $R_1$ to $R_8$ as defined above. Alkyl groups of length one to four carbons are preferred alkyl chain lengths.

In one embodiment of the present invention, a Zn(BOX) compound is used as a dopant at a level of 2.8 mol % in a CBP host (CBP is a carbazole "dimer", in which a carbazole molecule is attached to the 4 and 4' positions of biphenyl) and provides a quantum efficiency of 0.6%. The formula of 4,4'-N,N'-dicarbazole-biphenyl (CBP) is

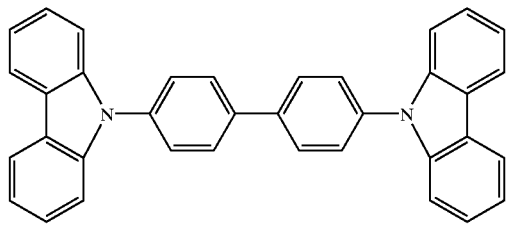

The compound $Zn(BOX)_2$ can function as a blue emitter, yielding blue light emission from an OLED; its photoluminescence shows both a fast decay and a slow decay both of color blue, wherein the fast decay corresponds to a fluorescence process and the slow decay corresponds to a phosphorescence process. Emitters showing both fluorescence and phosphorescence are of value in OLEDs.

These embodiments are discussed in more detail in the examples below. However the embodiments may operate by different mechanisms. Without limiting the scope of the invention, we discuss the different mechanisms.

II.B.1.c. Dexter and Förster Mechanisms

To understand the different embodiments of this invention it is useful to discuss the underlying mechanistic theory of energy transfer. There are two mechanisms commonly discussed for the transfer of energy to an acceptor molecule. In the first mechanism of Dexter transport (D. L. Dexter, "A theory of sensitized luminescence in solids," J. Chem. Phys., 1953, 21, 836–850), the exciton may hop directly from one molecule to the next. This is a short-range process dependent on the overlap of molecular orbitals of neighboring molecules. It also preserves the symmetry of the donor and acceptor pair (E. Wigner and E. W. Wittmer, Uber die Struktur der zweiatomigen Molekelspektren nach der Quantenmechanik, Zeitschrift fur Physik, 1928, 51, 859–886; M. Klessinger and J. Michl, Excited states and photochemistry of organic molecules (VCH Publishers, New York, 1995). Thus, the energy transfer of Eq. (1) is not possible via Dexter mechanism. In the second mechanism of Förster transfer (T. Förster, Zwischenmolekulare Energiewanderung and Fluoreszenz, Annalen der Physik, 1948, 2, 55–75; T. Förster, Fluoreszenz organischer Verbindugen (Vandenhoek and Ruprecht, Gottinghen, 1951 ), the energy transfer of Eq. (1) is possible. In Förster transfer, similar to a transmitter and an antenna, dipoles on the donor and acceptor molecules couple and energy may be transferred. Dipoles are generated from allowed transitions in both donor and acceptor molecules. This typically restricts the Förster mechanism to transfers between singlet states.

Nevertheless, as long as the phosphor can emit light due to some perturbation of the state such as due to spin-orbit coupling introduced by a heavy metal atom, it may participate as the donor in Förster transfer. The efficiency of the process is determined by the luminescent efficiency of the phosphor (F Wilkinson, in Advances in Photochemistry (eds. W. A. Noyes, G. Hammond, and J. N. Pitts, pp. 241–268, John Wiley & Sons, New York, 1964), i.e. if a radiative transition is more probable than a non-radiative decay, then energy transfer will be efficient. Such triplet-singlet transfers were predicted by Förster (T. Förster,"Transfer mechanisms of electronic excitation," Discussions of the Faraday Society, 1959, 27, 7–17) and confirmed by Ermolaev and Sveshnikova (V. L. Ermolaev and E. B. Sveshnikova, "Inductive-resonance transfer of energy from aromatic molecules in the triplet state," Doklady Akademii Nauk SSSR, 1963, 149, 1295–1298), who detected the energy transfer using a range of phosphorescent donors and fluorescent acceptors in rigid media at 77K or 90K. Large transfer distances are observed; for example, with triphenylamine as the donor and chrysoidine as the acceptor, the interaction range is 52 Å.

The remaining condition for Förster transfer is that the absorption spectrum should overlap the emission spectrum of the donor assuming the energy levels between the excited and ground state molecular pair are in resonance. In Example 1 of this application, we use the green phosphor fac tris(2-phenylpyridine) iridium $(Ir(Ppy)_3;$ M. A. Baldo, et al., Appl. Phys. Lett., 1999, 75, 4–6) and the red fluorescent dye [2-methyl-6-[2-(2,3,6,7-tetrahydro- 1H,5H-benzo[ij] quinolizin-9-yl) ethenyl]-4H-pyran-ylidene] propanedinitrile] ("DCM2"; C. W. Tang, S. A. VanSlyke, and C. H. Chen, "Electroluminescence of doped organic films," J. Appl. Phys., 1989, 65, 3610–3616). DCM2 absorbs in the green, and, depending on the local polarization field (V. Bulovic, et al., "Bright, saturated, red-to-yellow organic light-emitting devices based on polarization-induced spectral shifts," Chem. Phys. Lett., 1998, 287, 455–460), it emits at wavelengths between $\lambda=570$ nm and $\lambda=650$ nm.

It is possible to implement Förster energy transfer from a triplet state by doping a fluorescent guest into a phosphorescent host material. Unfortunately, such systems are affected by competitive energy transfer mechanisms that degrade the overall efficiency. In particular, the close proximity of the host and guest increase the likelihood of Dexter transfer between the host to the guest triplets. Once excitons reach the guest triplet state, they are effectively lost since these fluorescent dyes typically exhibit extremely inefficient phosphorescence.

To maximize the transfer of host triplets to fluorescent dye singlets, it is desirable to maximize Dexter transfer into the triplet state of the phosphor while also minimizing transfer into the triplet state of the fluorescent dye. Since the Dexter mechanism transfers energy between neighboring molecules, reducing the concentration of the fluorescent dye decreases the probability of triplet-triplet transfer to the dye. On the other hand, long range Förster transfer to the singlet state is unaffected. In contrast, transfer into the triplet state of the phosphor is necessary to harness host triplets, and may be improved by increasing the concentration of the phosphor.

II.B.2. Interrelation of Device Structure and Emission

Devices whose structure is based upon the use of layers of organic optoelectronic materials generally rely on a common mechanism leading to optical emission. Typically, this mechanism is based upon the radiative recombination of a trapped charge. Specifically, OLEDs are comprised of at least two thin organic layers separating the anode and cathode of the device. The material of one of these layers is specifically chosen based on the material's ability to transport holes, a "hole transporting layer" (HTL), and the material of the other layer is specifically selected according to its ability to transport electrons, an "electron transporting layer" (ETL). With such a construction, the device can be viewed as a diode with a forward bias when the potential applied to the anode is higher than the potential applied to the cathode. Under these bias conditions, the anode injects holes (positive charge carriers) into the hole transporting layer, while the cathode injects electrons into the electron transporting layer. The portion of the luminescent medium adjacent to the anode thus forms a hole injecting and transporting zone while the portion of the luminescent medium adjacent to the cathode forms an electron injecting and transporting zone. The injected holes and electrons each migrate toward the oppositely charged electrode. When an electron and hole localize on the same molecule, a Frenkel exciton is formed. Recombination of this short-lived state may be visualized as an electron dropping from its conduction potential to a valence band, with relaxation occurring, under certain conditions, preferentially via a photoemissive mechanism. Under this view of the mechanism of operation of typical thin-layer organic devices, the electroluminescent layer comprises a luminescence zone receiving mobile charge carriers (electrons and holes) from each electrode.

As noted above, light emission from OLEDs is typically via fluorescence or phosphorescence. There are issues with the use of phosphorescence. It has been noted that phosphorescent efficiency can decrease rapidly at high current densities. It may be that long phosphorescent lifetimes cause saturation of emissive sites, and triplet-triplet annihilation may also produce efficiency losses. Another difference between fluorescence and phosphorescence is that energy transfer of triplets from a conductive host to a luminescent guest molecule is typically slower than that of singlets; the long range dipole-dipole coupling (Förster transfer) which dominates energy transfer of singlets is (theoretically) forbidden for triplets by the principle of spin symmetry conservation. Thus, for triplets, energy transfer typically occurs by diffusion of excitons to neighboring molecules (Dexter transfer); significant overlap of donor and acceptor excitonic wavefunctions is critical to energy transfer. Another issue is that triplet diffusion lengths are typically long (e.g., >1400 Å) compared with typical singlet diffusion lengths of about 200 Å. Thus, if phosphorescent devices are to achieve their potential, device structures need to be optimized for triplet properties. In this invention, we exploit the property of long triplet diffusion lengths to improve external quantum efficiency.

Successful utilization of phosphorescence holds enormous promise for organic electroluminescent devices. For example, an advantage of phosphorescence is that all excitons (formed by the recombination of holes and electrons in an EL), which are (in part) triplet-based in phosphorescent devices, may participate in energy transfer and luminescence in certain electroluminescent materials. In contrast, only a small percentage of excitons in fluorescent devices, which are singlet-based, result in fluorescent luminescence.

An alternative is to use phosphorescence processes to improve the efficiency of fluorescence processes. . Fluorescence is in principle 75% less efficient due the three times higher number of symmetric excited states.

II.C. Background of Materials

II.C.1. Basic Heterostructures

Because one typically has at least one electron transporting layer and at least one hole transporting layer, one has layers of different materials, forming a heterostructure. The materials that produce the electroluminescent emission may be the same materials that function either as the electron transporting layer or as the hole transporting layer. Such devices in which the electron transporting layer or the hole transporting layer also functions as the emissive layer are referred to as having a single heterostructure. Alternatively, the electroluminescent material may be present in a separate emissive layer between the hole transporting layer and the electron transporting layer in what is referred to as a double heterostructure. The separate emissive layer may contain the emissive molecule doped into a host or the emissive layer may consist essentially of the emissive molecule.

That is, in addition to emissive materials that are present as the predominant component in the charge carrier layer, that is, either in the hole transporting layer or in the electron transporting layer, and that function both as the charge carrier material as well as the emissive material, the emissive material may be present in relatively low concentrations as a dopant in the charge carrier layer. Whenever a dopant is present, the predominant material in the charge carrier layer may be referred to as a host compound or as a receiving compound. Materials that are present as host and dopant are selected so as to have a high level of energy transfer from the host to the dopant material. In addition, these materials need to be capable of producing acceptable electrical properties for the OLED. Furthermore, such host and dopant materials are preferably capable of being incorporated into the OLED using materials that can be readily incorporated into the OLED by using convenient fabrication techniques, in particular, by using vacuum-deposition techniques.

II.C.2. Exciton Blocking Layer

One can have an exciton blocking layer in OLED devices to substantially block the diffusion of excitons, thus substantially keeping the excitons within the emission layer to enhance device efficiency. The material of blocking layer is characterized by an energy difference ("band gap") between its lowest unoccupied molecular orbital (LUMO) and its highest occupied molecular orbital (HOMO). This band gap substantially prevents the diffusion of excitons through the blocking layer, yet has only a minimal effect on the turn-on voltage of a completed electroluminescent device. The band gap is thus preferably greater than the energy level of excitons produced in an emission layer, such that such excitons are not able to exist in the blocking layer.

Specifically, the band gap of the blocking layer is at least as great as the difference in energy between the triplet state and the ground state of the host.

For a situation with a blocking layer between a hole-conducting host and the electron transporting layer, one seeks the following characteristics, which are listed in order of relative importance.

1. The difference in energy between the LUMO and HOMO of the blocking layer is greater than the difference in energy between the triplet and ground state singlet of the host material.
2. Triplets in the host material are not quenched by the blocking layer.
3. The ionization potential (IP) of the blocking layer is greater than the ionization potential of the host. (Meaning that holes are held in the host.)
4. The energy level of the LUMO of the blocking layer and the energy level of the LUMO of the host are sufficiently close in energy such that there is less than 50% change in the overall conductivity of the device.
5. The blocking layer is as thin as possible subject to having a thickness of the layer that is sufficient to effectively block the transport of excitons from the emissive layer into the adjacent layer.

That is, to block excitons and holes, the ionization potential of the blocking layer should be greater than that of the HTL, while the electron affinity of the blocking layer should be approximately equal to that of the ETL to allow for facile transport of electrons.

[For a situation in which the emissive ("emitting") molecule is used without a hole transporting host, the above rules for selection of the blocking layer are modified by replacement of the word "host" by "emitting molecule."]

For the complementary situation with a blocking layer between a electron-conducting host and the hole-transporting layer one seeks characteristics (listed in order of importance):

1. The difference in energy between the LUMO and HOMO of the blocking layer is greater than the difference in energy between the triplet and ground state singlet of the host material.
2. Triplets in the host material are not quenched by the blocking layer.
3. The energy of the LUMO of the blocking layer is greater than the energy of the LUMO of the (electron-transporting) host. (Meaning that electrons are held in the host.)
4. The ionization potential of the blocking layer and the ionization potential of the host are such that holes are readily injected from the blocker into the host and there is less than a 50% change in the overall conductivity of the device.
5. The blocking layer is as thin as possible subject to having a thickness of the layer that is sufficient to effectively block the transport of excitons from the emissive layer into the adjacent layer.

[For a situation in which the emissive ("emitting") molecule is used without an electron transporting host, the above rules for selection of the blocking layer are modified by replacement of the word "host" by "emitting molecule."]

II.D. Color

As to colors, it is desirable for OLEDs to be fabricated using materials that provide electroluminescent emission in a relatively narrow band centered near selected spectral regions, which correspond to one of the three primary colors, red, green and blue so that they may be used as a colored layer in an OLED or SOLED. It is also desirable that such compounds be capable of being readily deposited as a thin layer using vacuum deposition techniques so that they may be readily incorporated into an OLED that is prepared entirely from vacuum-deposited organic materials.

U.S. 08/772,333, filed Dec. 23, 1996, now U.S. Pat. No. 6,013,982 is directed to OLEDs containing emitting compounds that produce a saturated red emission.

III. SUMMARY OF THE INVENTION

At a general level, the present invention is directed to the use of complexes of transition metal species with organic benzoxazole ligands as dopants in the emitter layer of organic light emitting diodes. Using a heavy metal atom along with certain blue emitting ligands (typically benzoxazole derivatives), one obtains blue phosphorescence. Efficient electroluminescence is observed using CBP as a host and BCP as a hole blocking layer.

The general formula of the organometallic compound is as follows.

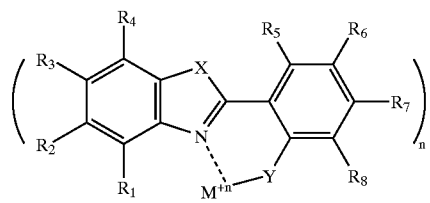

X, Y independently O, S

M represents a metal n is a integer for 1 to 3

$R_1$ to $R_8$ independently hydrogen atom, an aryl group or an alkyl group.

Preferred embodiments are within the following class:

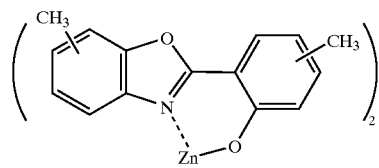

In this representation, the line segments to $CH_3$ (methyl) denote substitution at any allowed ring position by each methyl independently.

Specific preferred embodiments are the following compounds:

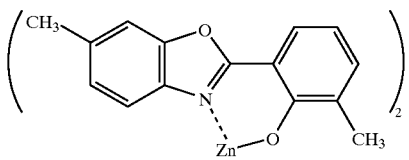

this is one species of the previous genus.

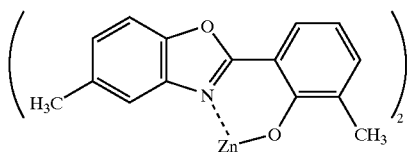

This is another species of the previous genus.
these are bis(2-(2-hydroxyphenyl)-benzoxazolate)zinc derivatives.
Preferred embodiments are also within the following class:

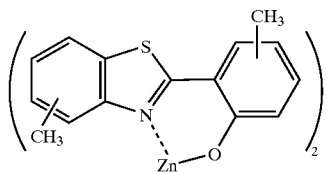

In this representation, the line segments to CH$_3$ (methyl) denote substitution at any allowwed ring position by each methyl independently.
Another preferred embodiment is the following compound.

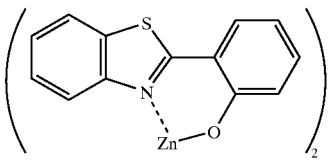

This is a bis(2-(2-hydroxyphenyl)-benzthiazolate)zinc derivative.

The invention is exemplified for the metal Zn, and it is expected useful results are obtained for Os, Ir, and Pt compounds with BOX and analogous derivatives.

Figure 9:
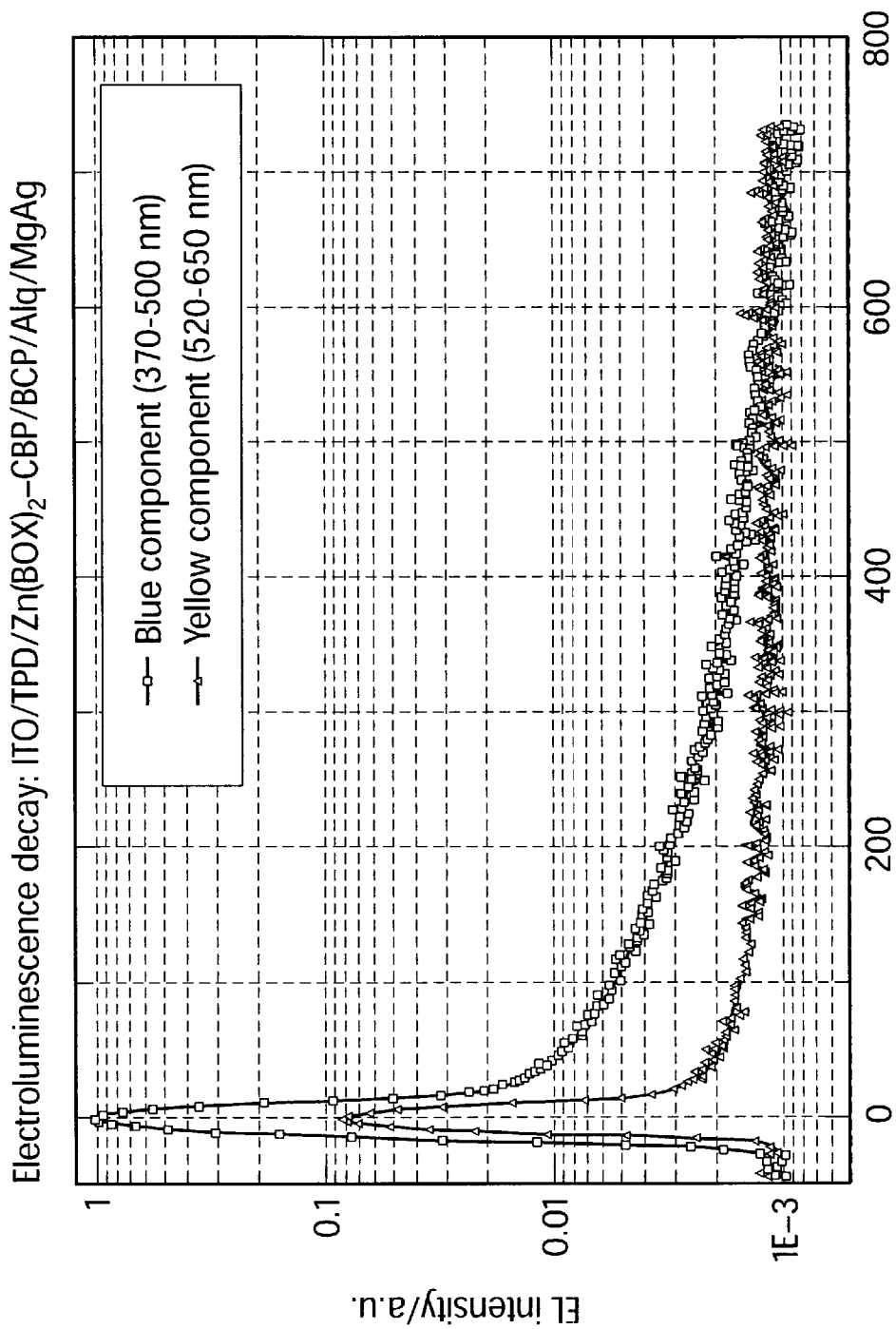
Figure 10:
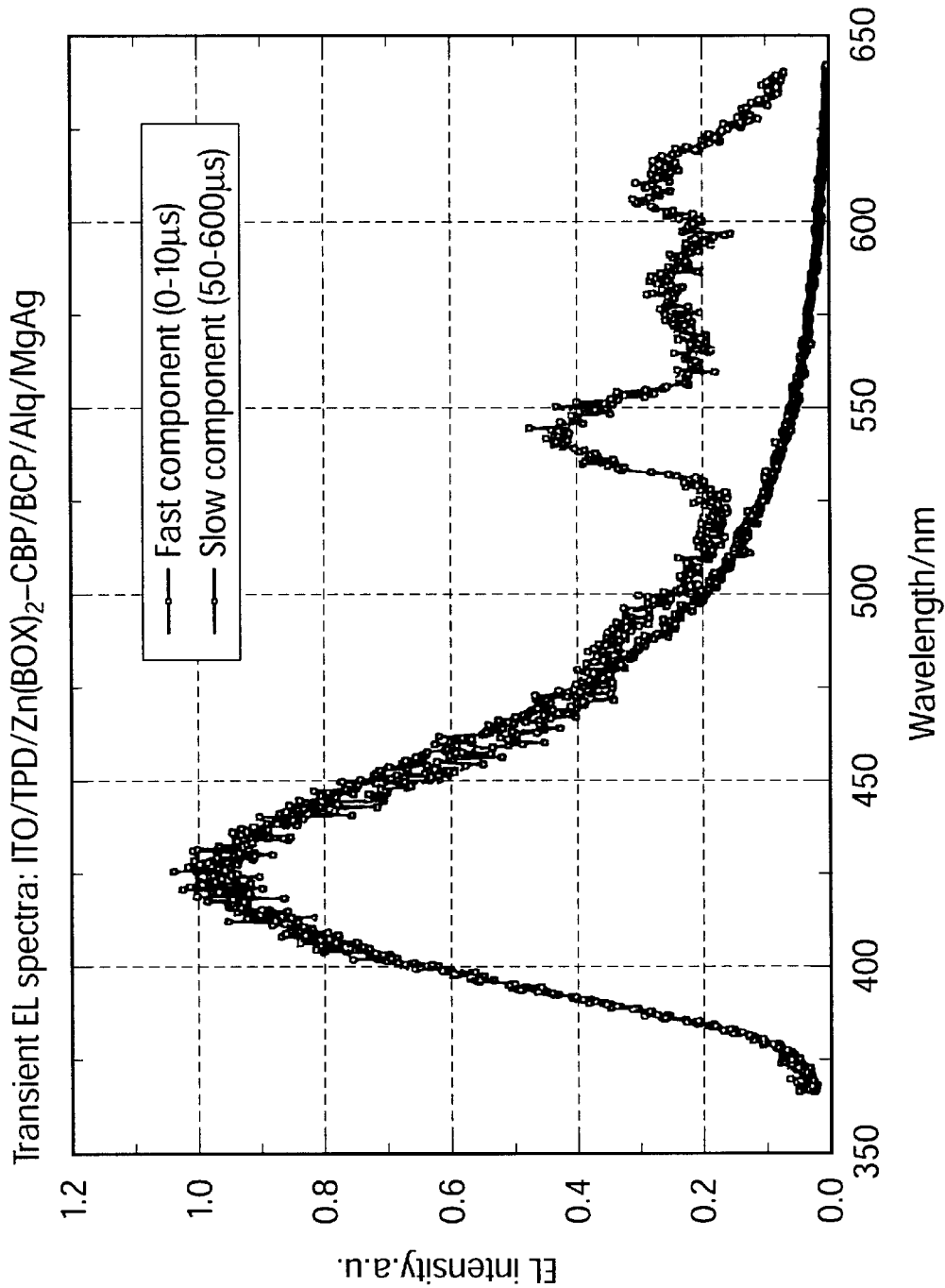

Another advantage of the OLED devices of this invention is based on the use of both fluorescence and phosphorescence. The theoretical treatment of carrier recombination revealed that hole and electron recombination creates 25% of singlet exciton (which is fluorescence) and 75% of triplet exciton (which is phosphorescence). Thus, if we use fluorescent molecules as an emitter, we can use only 25% of fluorescence for EL and the EL efficiency is limited. However, when we use the molecules which possess both of fluorescence and phosphorescence characters, we could obtain 100% luminescence in principle. In our experiment, we observed that Zn(BOX)$_2$ as an emitting material shows both luminescences. While the observed EL efficiency is around 0.3–0.6% at room temperature, we can expect higher efficiency with the routine optimization of the molecular structures and device structures according to the teachings of this invention. In addition, Zn(BOX)$_2$ is a promising material for particularly blue emission. In the first device the CIE was true blue;(X=0.16, Y=0.059). FIGS. 1–8 describe working examples. FIGS. 9 and 10 prove that the electroluminescence is composed of both fluorescence and phosphorescence.

IV. BRIEF DESCRIPTION OF THE DRAWINGS

Figure 1:
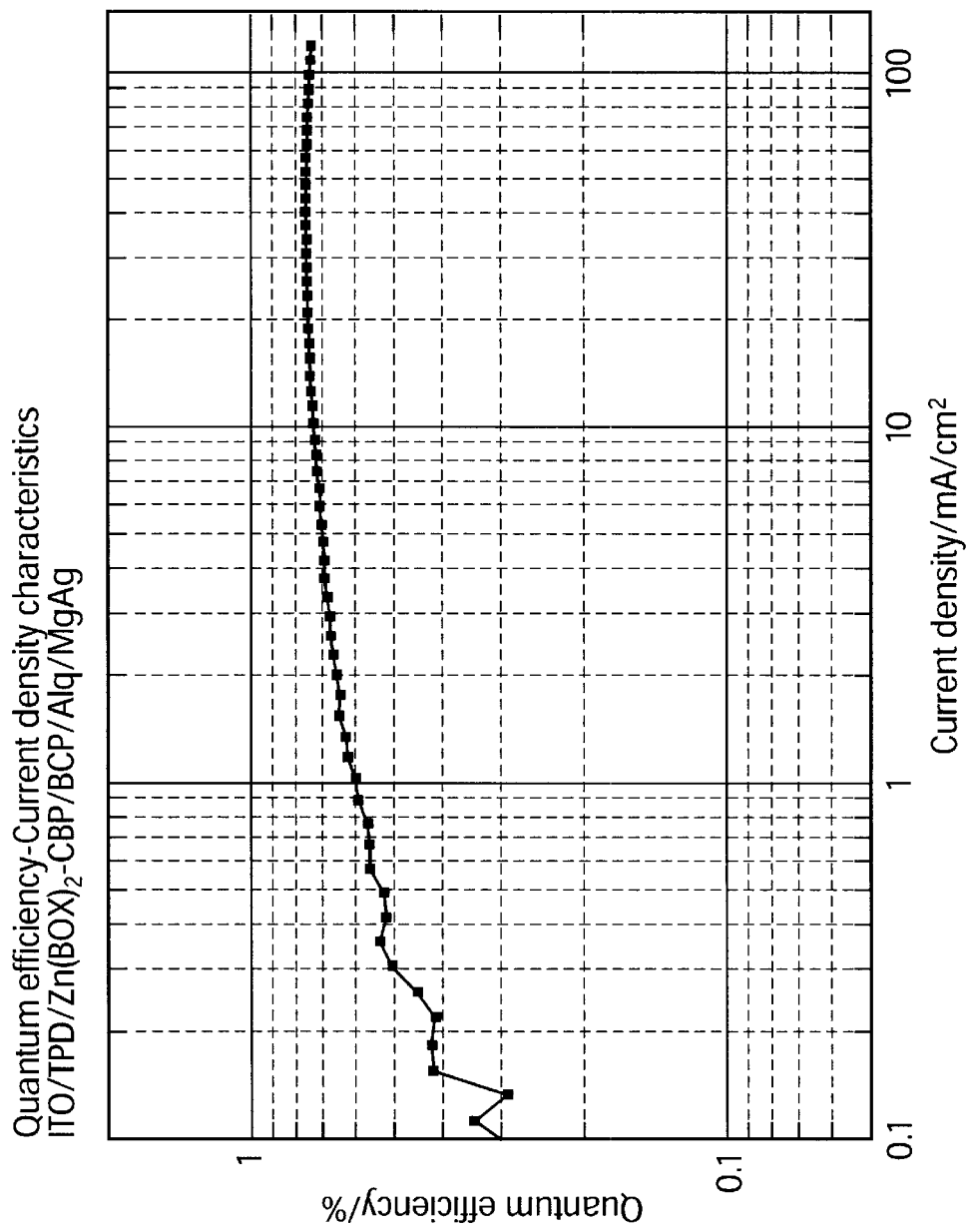

FIG. 1. Quantum efficiency as a function of current density for the device of Example 1. (Device: ITO/TPD(50 nm)/Zn(BOX)2.8 mol %-CBP(20 nm)/BCP(10 nm)/Alq3 (20 nm)/MgAg/Ag)

Figure 2:
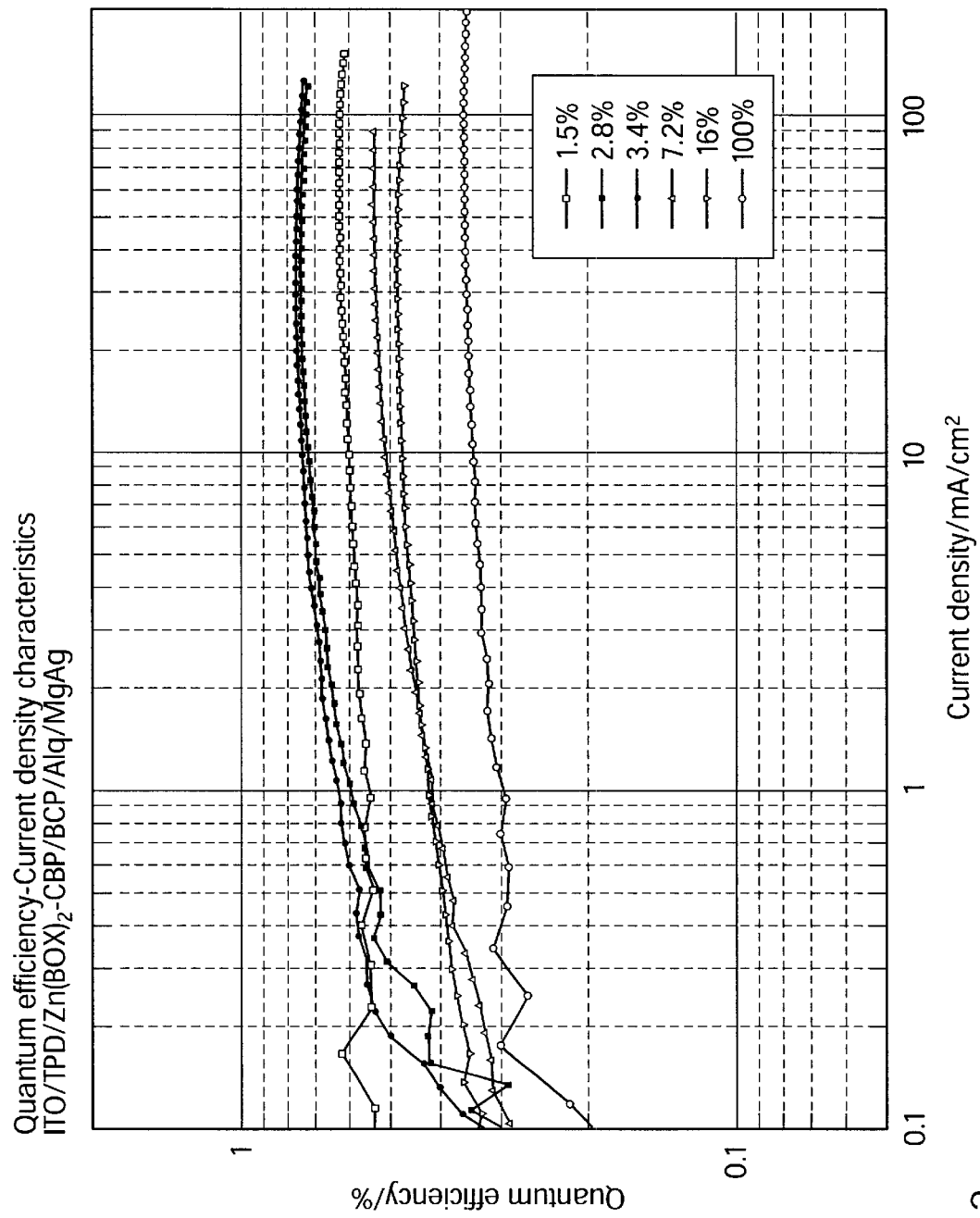

FIG. 2. Quantum efficiency as a function of current density and doping level (box) for the device of Example 1.

Figure 3:
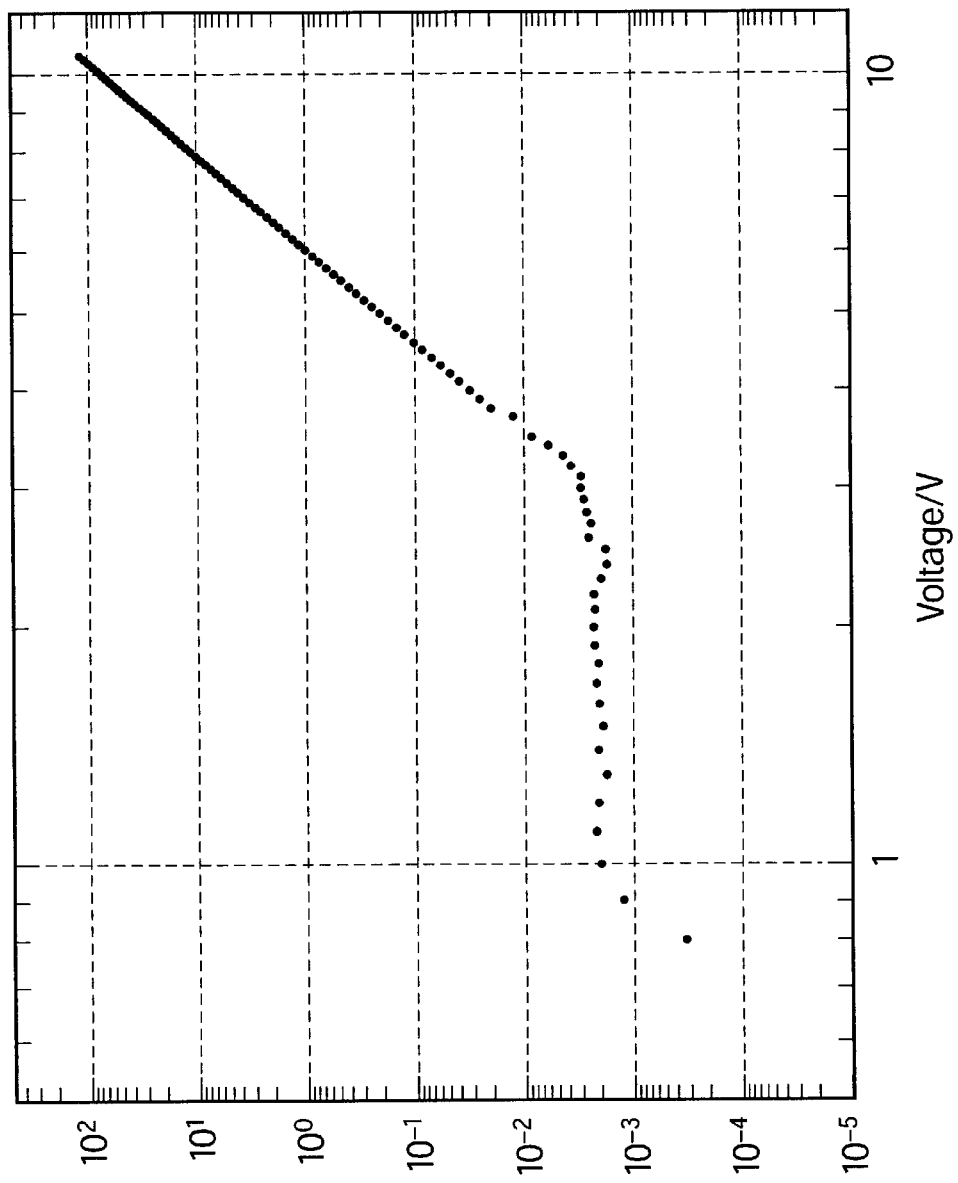

FIG. 3. Current density as a function of voltage for the device of Example 1.

FIG. 4. Electroluminescence spectrum of the device of Example 1.

Figure 5:
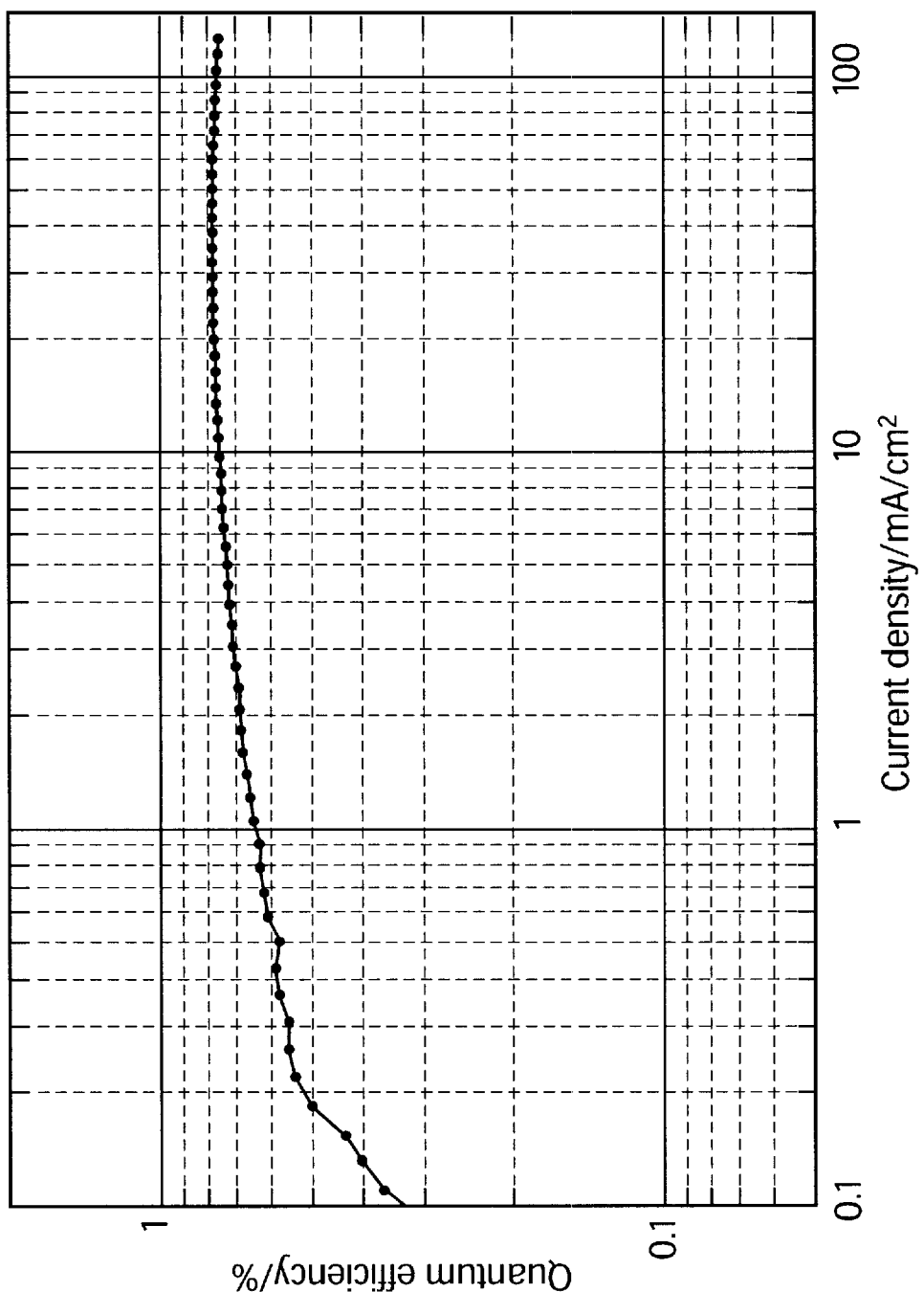

FIG. 5. Quantum efficiency as a function of current density for the device of Example 2. (Device: ITO/TPD(50 nm)/Zn(BOX)3.4 mol %-TPD(20 nm)/BCP(10 nm)/Alq3 (20 nm)/MgAg/Ag)

Figure 6:
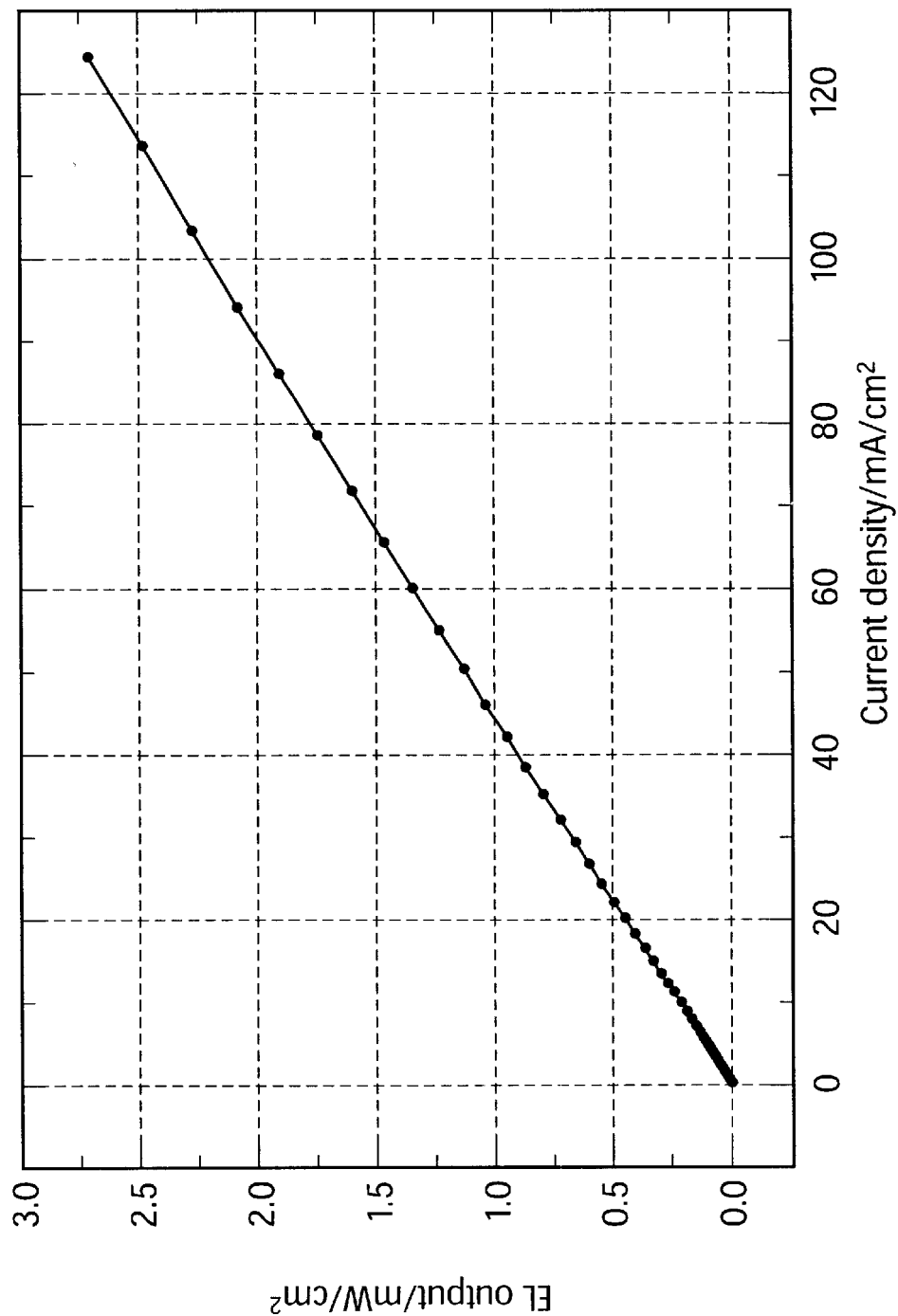

FIG. 6. Output power as a function of current density for the device of Example 2.

Figure 7:
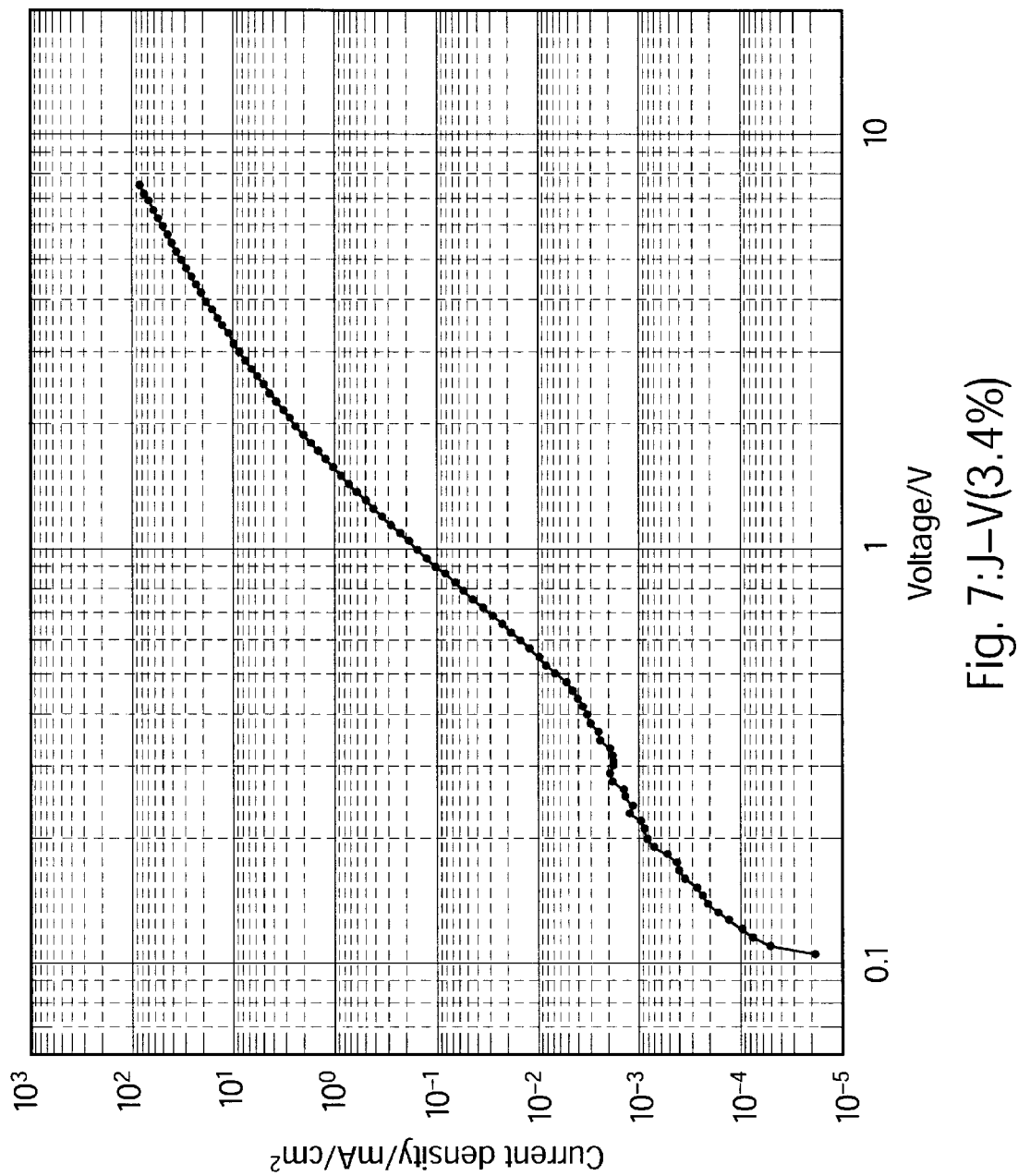

FIG. 7. Current density as a function of voltage for the device of Example 2.

FIG. 8. Electroluminescence spectrum of the device of Example 2.

FIG. 9. Luminescent output as a function of time.

FIG. 10. EL intensity as a function of wavelength for fast and slow component, showing both have blue aspect.

V. DETAILED DESCRIPTION OF THE INVENTION

V.A. Chemistry

This invention is directed to the use of certain organometallic molecules doped into a host phase in an emitter layer of an organic light emitting diode.

V.A.1. Dopants

The general chemical formula for the molecules which are doped into the host phase is as follows.

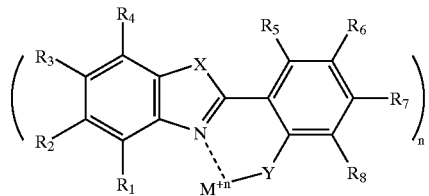

X, Y independently O, S

M represents a metal n is a integer for 1 to 3

R$_1$ to R$_8$ independently hydrogen atom, an aryl group or an alkyl group.

A preferred embodiment class is as follows

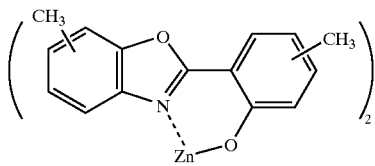

and a specific preferred embodiment species is

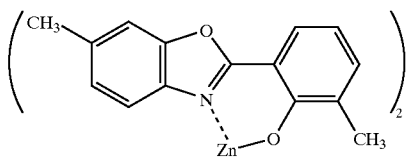

Another preferred embodiment is

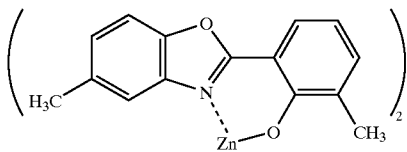

These are within the genus of bis(2-(2-hydroxyphenyl)-benzoxazolate)zinc derivatives.

An important aspect of the present invention is the discovery that when the above-noted compound,

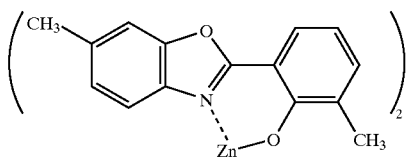

with the methyl groups on the aromatic rings, is used in an OLED, the electroluminescence shows both fluorescence and phosphorescence, in contrast to the compound without the methyl groups. We can expect more strong phosphorescence by introducing other substituents.

Another preferred embodiment class is as follows.

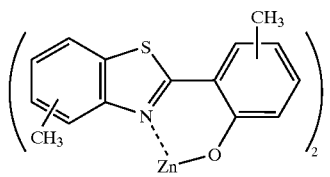

A specific preferred embodiment is

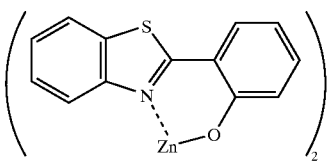

These are within the genus of bis(2-(2-hydroxyphenyl)-benzthiazolate)zinc derivatives.

V.A.2. Potential Host Molecules

This invention is directed toward the use of the above-noted dopants in a host phase. This host phase may be comprised of molecules comprising a carbazole moiety. Molecules which fall within the scope of the invention are included in the following.

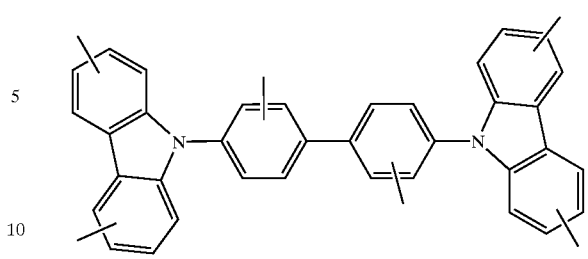

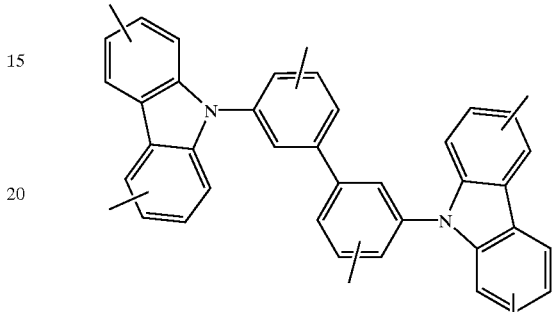

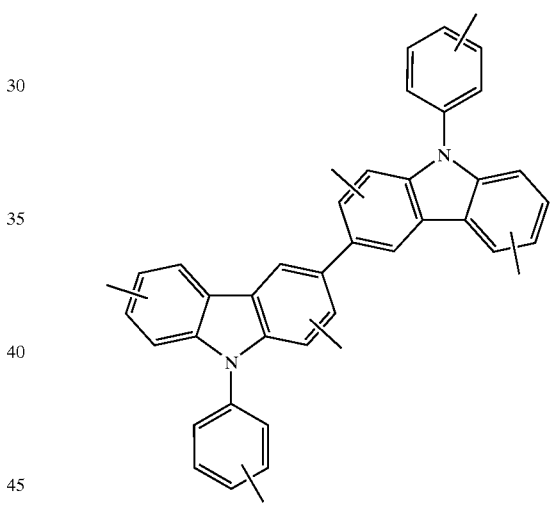

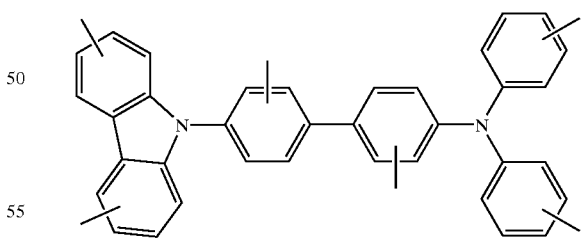

[A line segment denotes possible substitution at any available carbon atom or atoms of the indicated by ring by alkyl or aryl groups.]

A preferred molecule with a carbazole functionality is 4,4'-N,N'-dicarbazole-biphenyl (CBP), which has the formula

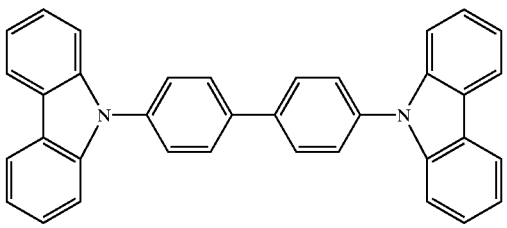

V.B.1. Device Preparation

The device structure that we chose to use is very similar to the standard vacuum deposited one. As an overview, a hole transporting layer ("HTL") is first deposited onto the ITO (indium tin oxide) coated glass substrate. For all of the devices described here, the HTL consisted of 50 nm (500 Å) of TPD. [TPD is N,N'-diphenyl-N,N'-bis (3-methylphenyl)-1,1'-biphenyl-4,4'diamine.] Onto the TPD a thin film of the organometallic doped into a host matrix is deposited to form an emitter layer. A blocking layer is deposited onto the emitter layer. An electron transport layer is deposited onto the blocking layer. The device is finished by depositing a Mg-Ag electrode onto the electron transporting layer. All of the depositions were carried out at a vacuum less than $5 \times 10^{-5}$ Torr. The devices were tested in air, without packaging.

Further details are as follows. After the cleaning of an ITO substrate (solvent cleaning and finally UV treatment), all organic layers and metal cathode were vacuum vapor deposited at the vacuum of $10^{-6}$ torr. The emission layer ("EML") was formed by the co-deposition of the Zn(BOX) compound and CBP with a separate crucible. The meaning of this structure is effective injection of hole and electron charge carriers from TPD and BCP/Alq layers into EML and confinement of excited states inside EML. The double electron transport layer (ETL of BCP/Alq) contributes to reduce electron injection barrier. MgAg layer was also fabricated with the co-deposition method.

When we apply a voltage between the cathode and the anode, holes are injected from ITO to TPD and transported by the TPD layer, while electrons are injected from MgAg to Alq and transported through Alq and BCP. Then holes and electrons are injected into EML and carrier recombination occurs in CBP, the excited states were formed, energy transfer to $Zn(BOX)_2$ occurs and finally $Zn(BOX)_2$ molecules are excited and decay radiatively. Also, it is possible that the recombination occurs directly in the $Zn(BOX)_2$ molecule and it decays radiatively. We cannot specify which processes are dominant in EL process.

V.B.2. Example 1

The results for Example 1 were obtained using device 1, wherein device 1 has the following composition.

> Device 1: ITO(120 nm)/TPD(50 nm)/Zn(BOX)₂(specifically the molecule of formula 1, below)2.8%-CBP(20 nm)/BCP(10 nm)/Alq3(20 nm)/MgAg(150 nm)/Ag(50 nm) wherein ITO is a transparent conducting phase of indium tin oxide which functions as an anode.

ITO is a degenerate semiconductor formed by doping a wide band semiconductor. The carrier concentration of the ITO is in excess of $10^{19}/cm^3$. The number 120 nm (=1200 Å) is the thickness of the ITO layer.

TPD: hole transport layer (HTL) of thickness 50 nm.

Zn(BOX)2(guest)-CBP(host): emitter layer (EML) of thickness 10 nm.

BCP is an exciton blocking and electron transport layer of thickness 10 nm.

Alq3: electron injection layer of thickness 20 nm.

MgAg(thickness 150 nm)/Ag (thickness 50 nm) functions as a cathode TPD, the hole transport layer, has the following formula.

TPD

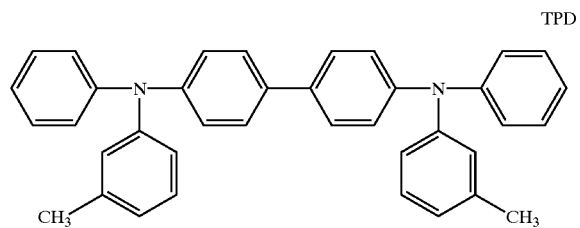

The organometallic dopant $Zn(BOX)_2$ (denoted formula 1) has the following formula.

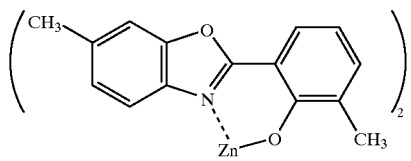

An isomer of 1 has the formula:

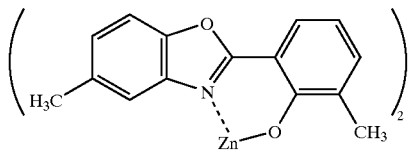

These are bis(2-(2-hydroxyphenyl)-benzoxazolate)zinc derivatives.

This organometallic compound is doped into a host material comprising 4,4'-N,N'-dicarbazole-biphenyl (CBP), which has the formula

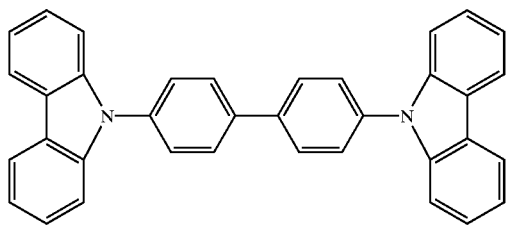

BCP functions as an electron transport layer and as an exciton blocking layer, which layer has a thickness of about 10 nm (100 Å). BCP is 2,9-dimethyl-4,7-diphenyl-1,10-phenanthroline (also called bathocuproine) which has the formula

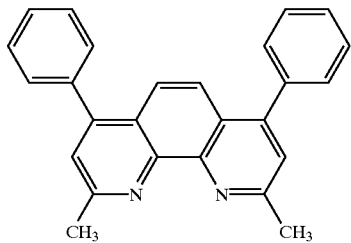

The Alq3, which functions as an electron injection/electron transport layer has the following formula.

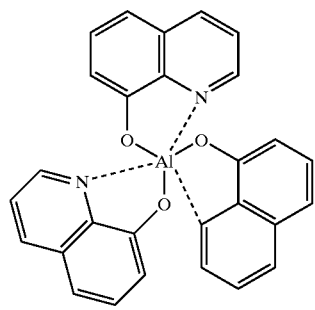

Alq₃

In comparative experiments, the doping level is varied to establish the optimum doping level.

The results for device 1 are depicted in FIGS. 1–4 which include quantum efficiency as a function of current density (efficiency of 0.78%), output power as a function of current density, current density as a function of voltage, and the electroluminescence spectrum of the device.

V.B.3. Example 2

Results for Example 2 were obtained from device 2, of the following configuration.

Device 2: ITO(120 nm)/TPD(50 nm)/Zn(BOX)₂(as depicted in formula 1) 2 2.8%-TPD(20 nm)/BCP(10 nm)/Alq3(20 nm)/ MgAg(150 nm)/Ag(50 nm) wherein ITO functions as an anode and has thickness 120 nm.

TPD: hole transport layer (HTL), of thickness 50 nm.

Zn(BOX)₂(guest)-TPD(host): emitter layer (EML), of thickness 20 nm.

BCP: exciton blocking and electron transport layer, of thickness 10 nm

Alq3: electron injection layer, of thickness 20 nm and MgAg(thickness 150 nm)/Ag(thickness50 nm) as a cathode electrode.

The chemical names are used as in Example 1.

The results for Example 2/device 2 are given in FIGS. 5 through 8.

V. C. Other Molecular Depictions

A molecule for the hole-transporting layer of the invention is depicted below.

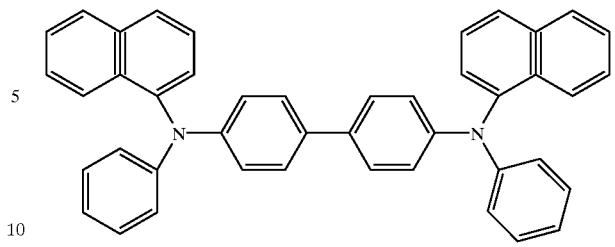

The invention will work with other hole-transporting molecules known by one of ordinary skill to work in hole transporting layers of OLEDs.

The molecule which used as the host in the emissive layer of the invention is depicted below.

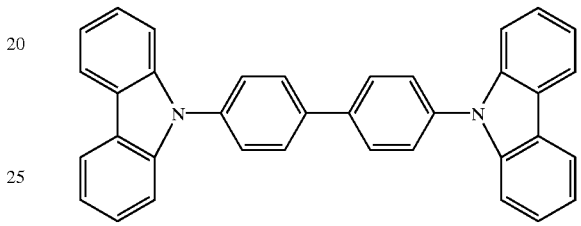

The invention will work with other molecules comprising a carbazole functionality, or an analogous aryl amine functionality.

V.D. Uses of Device

The OLED of the present invention may be used in substantially any type of device which is comprised of an OLED, for example, in OLEDs that are incorporated into a larger display, a vehicle, a computer, a television, a printer, a large area wall, theater or stadium screen, a billboard or a sign.

The present invention as disclosed herein may be used in conjunction with co-pending applications: "High Reliability, High Efficiency, Integratable Organic Light Emitting Devices and Methods of Producing Same", Ser. No. 08/774, 119 (filed Dec. 23, 1996), now U.S. Pat. No. 6,046,543; "Novel Materials for Multicolor Light Emitting Diodes", Ser. No. 08/850,264 (filed May 2, 1997), now U.S. Pat. No. 6,045,930; "Electron Transporting and Light Emitting Layers Based on Organic Free Radicals", Ser. No. 08/774,120 (filed Dec. 23, 1996), now U.S. Pat. No. 5,811,833; "Multicolor Display Devices", Ser. No. 08/772,333 (filed Dec. 23, 1996), now U.S. Pat. No. 6,013,982; "Red-Emitting Organic Light Emitting Devices (OLED's)", Ser. No. 08/774,087 (filed Dec. 23, 1996), now U.S. Pat. No. 6,048,630; "Driving Circuit For Stacked Organic Light Emitting Devices", Ser. No. 08/792,050 (filed Feb. 3, 1997), now U.S. Pat. No. 5,757,139; "High Efficiency Organic Light Emitting Device Structures", Ser. No. 08/772,332 (filed Dec. 23, 1996), now U.S. Pat. No. 5,834,893; "Vacuum Deposited, Non-Polymeric Flexible Organic Light Emitting Devices", Ser. No. 08/789,319 (filed Jan. 23, 1997), now U.S. Pat. No. 5,844,363; "Displays Having Mesa Pixel Configuration", Ser. No. 08/794,595 (filed Feb. 3, 1997), now U.S. Pat. No. 6,091,195; "Stacked Organic Light Emitting Devices", Ser. No. 08/792,046 (filed Feb. 3, 1997), now U.S. Pat. No. 5,917,280; "High Contrast Transparent Organic Light Emitting Device Display", Ser. No. 08/821,380 (filed Mar. 20, 1997), now U.S. Pat. No. 5,986,401; "Organic Light Emitting Devices Containing A Metal Complex of 5-Hydroxy-Quinoxaline as A Host Material", Ser. No. 08/838,099 (filed Apr. 14, 1997), now U.S. Pat. No. 5,861,219; "Light Emitting Devices Having High Brightness", Ser. No. 08/844,353 (filed Apr. 18, 1997), now U.S. Pat. No. 6,125,226; "Organic Semiconductor Laser", Ser. No. 08/859,468 (filed May 19, 1997), now U.S. Pat. No. 6,111,902; "Saturated Full Color Stacked Organic Light Emitting Devices", Ser. No. 08/858,994 (filed May 20, 1997), now U.S. Pat. No. 5,932,895; "Plasma Treatment of Conductive Layers", International Application No. PCT/US97/10252, (filed Jun. 12, 1997); "Novel Materials for Multicolor Light Emitting Diodes", Ser. No. 08/814,976, (filed Mar. 11, 1997), abandoned; "Novel Materials for Multicolor Light Emitting Diodes", Ser. No. 08/771,815, (filed Dec. 23, 1996), converted to Provisional Application No. 60/072,095; "Patterning of Thin Films for the Fabrication of Organic Multi-color Displays", International Application No. PCT/US97/10289, (filed Jun. 12, 1997); and "Double Heterostructure Infrared and Vertical Cavity Surface Emitting Organic Lasers", International Application No. PCT/US98/09480 filed May 8, 1998; U.S. Pat. No. 5,874,803 issued Feb. 23, 1999; U.S. Pat. No. 5,707,745 issued Jan. 13, 1998; U.S. Pat. No. 5,703,436 issued Dec. 30, 1997; and U.S. Pat. No. 5,757,026 issued May 26, 1998 each co-pending application or patent being incorporated herein by reference in its entirety.

What is claimed is:

1. An organic light emitting device comprising an emitter layer comprising a host and a dopant wherein the dopant comprises a molecule of the formula

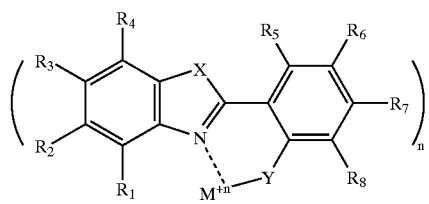

X, Y independently represent O, S

M represents a metal selected from the group consisting of osmium, iridium and platinum n is an integer of 1 to 3

$R_1$ to $R_8$ independently represent a hydrogen atom, an aryl group or an alkyl group.

2. The device of claim 1 wherein the host is selected from the group consisting of

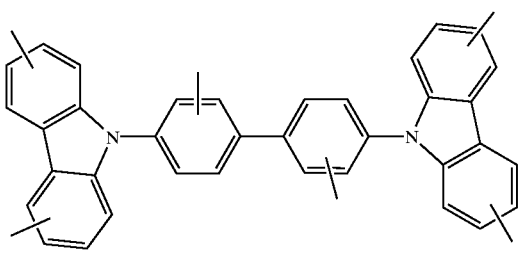

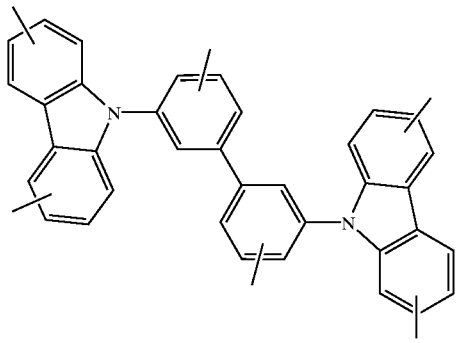

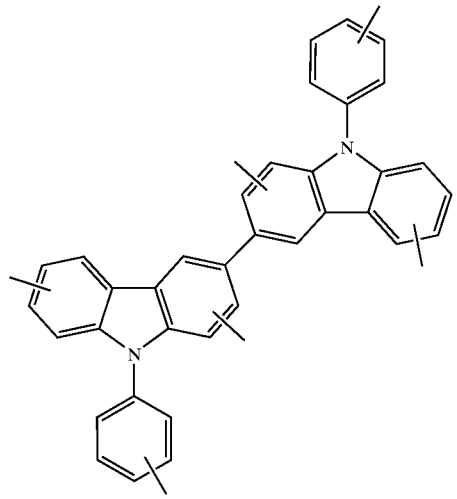

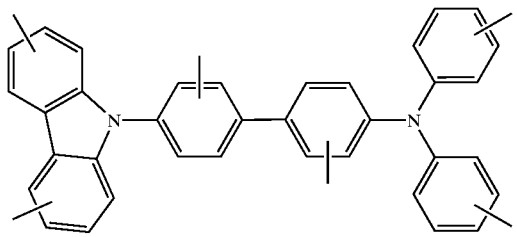

wherein the notation of the line segment drawn through the aromatic ring denotes substitution at any carbon in that ring by alkyl or aryl.

3. The device of claim 1 wherein the host is 4,4'-N,N'-dicarbazole-biphenyl (CBP), which has the formula

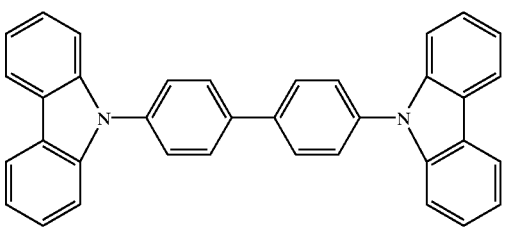

4. The device of claim 1 wherein the dopant emits light via both phosphorescence and fluorescence.

5. The device of claim 1 wherein there is an emission from the emitter layer of a single color via both phosphorescence and fluorescence.

6. The device of claim 1 wherein there is an emission from the emitter layer comprising blue phosphorescence.

7. The device of claim 1 wherein $R_3$ is alkyl, X is O, and Y is O.

8. The device of claim 1 incorporated into a larger display, a vehicle, a computer, a television, a printer, a large area wall, theater or stadium screen, a billboard or a sign.

9. The device of claim 1 wherein M is osmium.

10. The device of claim 1 wherein M is iridium.

11. The device of claim 1 wherein M is platinum.

* * * * *

UNITED STATES PATENT AND TRADEMARK OFFICE
CERTIFICATE OF CORRECTION

PATENT NO. : 6,458,475 B1
DATED : October 1, 2002
INVENTOR(S) : Adachi et al.

It is certified that error appears in the above-identified patent and that said Letters Patent is hereby corrected as shown below:

<u>Title page, Item [54] and Column 1, line 1,</u>
Please change the title as follows: change "ORGANIC LIGHT EMITTING DIODE HAVING A BLUE PHOSPHORESCENT MOLECULE AS AN EMITTER" to -- EMISSIVE MATERIALS FOR ORGANIC LIGHT EMITTING DEVICES --.

Signed and Sealed this

First Day of April, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,458,475 B1
DATED : October 1, 2002
INVENTOR(S) : Adachi et al.

It is certified that error appears in the above-identified patent and that said Letters Patent is hereby corrected as shown below:

Column 9,
Line 1, change "this" to -- This --;
Line 11, change "these" to -- These --; and
Line 24, change "allowwed" to -- allowed --.

Signed and Sealed this

Eighth Day of June, 2004

JON W. DUDAS
*Acting Director of the United States Patent and Trademark Office*